United States Patent
Xu

(10) Patent No.: US 8,076,683 B2
(45) Date of Patent: Dec. 13, 2011

(54) SURFACE-TEXTURED ENCAPSULATIONS FOR USE WITH LIGHT EMITTING DIODES

(75) Inventor: Tao Xu, Fremont, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/704,326

(22) Filed: Feb. 11, 2010

(65) Prior Publication Data

US 2010/0140652 A1    Jun. 10, 2010

Related U.S. Application Data

(62) Division of application No. 12/163,594, filed on Jun. 27, 2008.

(51) Int. Cl.
*H01L 33/00* (2010.01)
*H01L 23/29* (2010.01)

(52) U.S. Cl. ............. 257/95; 257/99; 257/100; 257/791

(58) Field of Classification Search .................. 257/95, 257/99, 100, 791, E33.057
See application file for complete search history.

(56) References Cited

U.S. PATENT DOCUMENTS

| | | | |
|---|---|---|---|
| 5,993,075 A | 11/1999 | Huang et al. | |
| 6,133,589 A | 10/2000 | Krames et al. | |
| 6,649,440 B1 | 11/2003 | Krames et al. | |
| 7,187,501 B2 * | 3/2007 | Wakisaka | 359/622 |
| 7,193,720 B2 | 3/2007 | Gatt | |
| 7,268,371 B2 | 9/2007 | Krames et al. | |
| 2006/0054904 A1* | 3/2006 | Lin et al. | 257/88 |
| 2006/0105484 A1* | 5/2006 | Basin et al. | 438/27 |
| 2007/0145397 A1 | 6/2007 | DenBaars et al. | |
| 2007/0148442 A1 | 6/2007 | Shibayama et al. | |
| 2007/0257271 A1 | 11/2007 | Ouderkirk et al. | |
| 2008/0035936 A1 | 2/2008 | Lester | |
| 2008/0128730 A1 | 6/2008 | Fellows et al. | |
| 2009/0153023 A1 | 6/2009 | Shylo et al. | |

OTHER PUBLICATIONS

PCT Search Report with Written Opinion, PCT/US09/048184, Aug. 17, 2009.
U.S. Appl. No. 12/039,563, filed Feb. 28, 2008, Ray-Hua Horng.
U.S. Appl. No. 12/163,594, filed Jun. 27, 2008, Tao Xu.

* cited by examiner

*Primary Examiner* — William M. Brewster
(74) *Attorney, Agent, or Firm* — Haynes and Boone, LLP

(57) ABSTRACT

Surface-textured encapsulations for use with light emitting diodes. In an aspect, a light emitting diode apparatus is provided that includes a light emitting diode, and an encapsulation formed upon the light emitting diode and having a surface texture configured to extract light. In an aspect, a method includes encapsulating a light emitting diode with an encapsulation having a surface texture configured to extract light. In an aspect, a light emitting diode lamp is provided that includes a package, at least one light emitting diode disposed within the package, and an encapsulation formed upon the at least one light emitting diode having a surface texture configured to extract light. In another aspect, a method includes determining one or more regions of an encapsulation, the encapsulation configured to cover a light emitting diode, and surface-texturing each region of the encapsulation with one or more geometric features that are configured to extract light.

12 Claims, 5 Drawing Sheets

SURFACE-TEXTURED ENCAPSULATIONS FOR USE WITH LIGHT EMITTING DIODES

RELATED APPLICATIONS

This patent application is a Divisional Patent Application of patent application Ser. No. 12/163,594, filed on Jun. 27, 2008 entitled SURFACE-TEXTURED ENCAPSULATIONS FOR USE WITH LIGHT EMITTING DIODES, the entire content of which is hereby expressly incorporated by reference.

BACKGROUND

1. Field

The present application relates generally to light emitting diodes, and more particularly, to surface-textured encapsulations for use with light emitting diodes that provide for enhanced light output.

2. Background

Light emitting diodes (LEDs) for use as indicators are well known. LEDs have been used extensively for this purpose in consumer electronics. For example, red LEDs are commonly used to indicate that power has been applied to devices such as radios, televisions, video recorder (VCRs) and the like.

Recently, high-power LEDs have seen increased use in general lighting applications. For example, power LEDs can now be found in overhead lighting, table lamps, and in automotive application, such as in automobile headlamps. Typically, high-power LEDs are provided as part of an assembly comprising a LED mounted to a substrate and protected by encapsulation. Light emitted from the LED passes through the encapsulation before it is visible to a user. However, there is light loss in the encapsulation layer in the LEDs. This is due in part to internal reflections occurring at the interface between the encapsulation and the air.

Various techniques have been tried to improve the light output of the LEDs. For example, the addition of a lens to the encapsulation layer has been used to extract additional light. However, the additional lens material impacts the thermal properties of the LED assembly by reducing heat dissipation. Also, the addition of the lens increases the cost of processing and manufacture of the LED assembly.

Therefore, what is needed is a way to increase the optical output of high power LEDs while providing excellent heat dissipation and reduced processing and manufacturing costs.

SUMMARY

In one or more aspects, a surface-textured encapsulation layer is provided for use with one or more light emitting diodes so as to provide increased optical output, excellent heat dissipation, and reduced processing costs.

In an aspect, a light emitting diode apparatus is provided that comprises a light emitting diode, and an encapsulation formed upon the light emitting diode and having a surface texture configured to extract light.

In an aspect, a method is provided for forming a light emitting diode apparatus. The method comprises encapsulating a light emitting diode with an encapsulation having a surface texture configured to extract light.

In an aspect, a light emitting diode lamp is provided that comprises a package, at least one light emitting diode disposed within the package, and an encapsulation formed upon the at least one light emitting diode having a surface texture configured to extract light.

In an aspect, an illumination device is provided that comprises a power source, and a light emitting diode lamp in electrical communication with the power source. The lamp comprises a package, at least one light emitting diode, and an encapsulation formed upon the at least one light emitting diode having a surface texture configured to extract light.

In an aspect, a method is provided for forming a light emitting diode apparatus. The method comprises determining one or more regions of an encapsulation, the encapsulation formed upon a light emitting diode, and surface-texturing each region of the encapsulation with one or more geometric features that are configured to extract light.

Other aspects will become apparent after review of the hereinafter set forth Brief Description of the Drawings, Description, and the Claims.

BRIEF DESCRIPTION OF THE DRAWINGS

The foregoing aspects described herein will become more readily apparent by reference to the following Description when taken in conjunction with the accompanying drawings wherein.

DESCRIPTION

In various aspects, a surface-textured encapsulation is provided for use with one or more light emitting diodes so as to provide increased optical output, improved heat dissipation, and reduced processing costs.

The following definitions define terms for use in this document.

1. Active region—the region in a light-emitting diode where injected electrons and holes recombine to generate photons in a LED when current is applied.
2. "Formed upon" means "deposited, etched, attached, or otherwise prepared or fabricated upon" when referring to the forming the various layers.
3. Package—the assembly of elements that houses one or more LED chips, and provides an interface between the LED chip(s) and a power source to the LED chip(s).
4. Transparent—no significant obstruction or absorption of electromagnetic radiation in a particular wavelength (or wavelengths) of interest.

Figure 1:
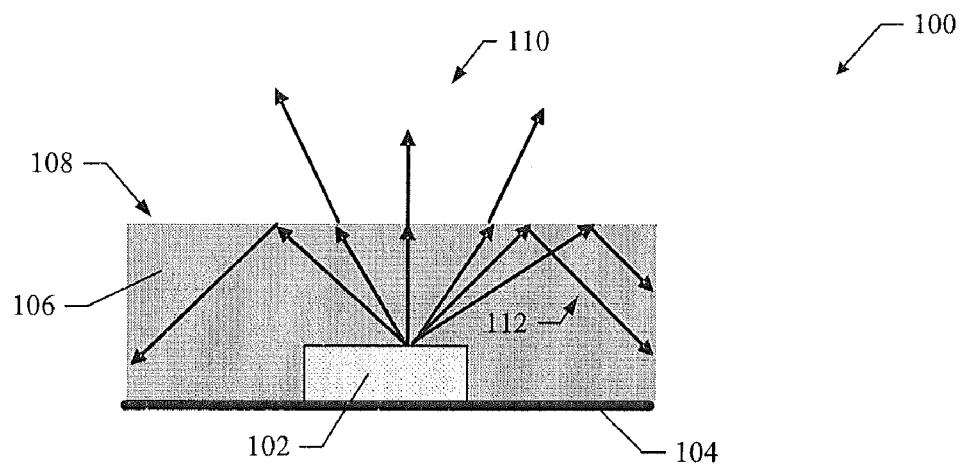
FIG. 1 shows a LED assembly with a conventional encapsulation.

FIG. 1 shows a LED assembly 100 with a conventional encapsulation. The LED assembly 100 comprises a LED 102 mounted to a substrate 104. The substrate provides electrical power to the LED which converts the electrical power to light and the light is emitted from the surface of the LED 102. The LED 102 is encapsulated with an encapsulation 106 that has a flat smooth surface as illustrated at 108. During operation, light emitted from the LED 102 travels through the encapsulation 106 and is emitted from the LED assembly 100 as illustrated at 110. However, because of the smooth flat surface 108 of the encapsulation 106, some light emitted from the LED 102 is incident upon the surface 108 at an angle that is less than a critical angle. The critical angle is an angle formed between a boundary and incident light and is determined by the refractive index property of the materials at the interface. Light striking the boundary at less than the critical angle will be reflected back into the encapsulation instead of passing through the boundary. As illustrated at 112, light reflected within the encapsulation 106 is not emitted from the LED assembly 100. Thus, the LED assembly 100 operates inefficiently and therefore provides reduced light output. Conventional LED assembles may include additional lens material added to the encapsulation to remove the total internal reflection and to extract more light. However, the added lens material reduces the heat dissipation properties of the LED assembly 100 and adds additional processing and manufacturing costs.

Figure 2:
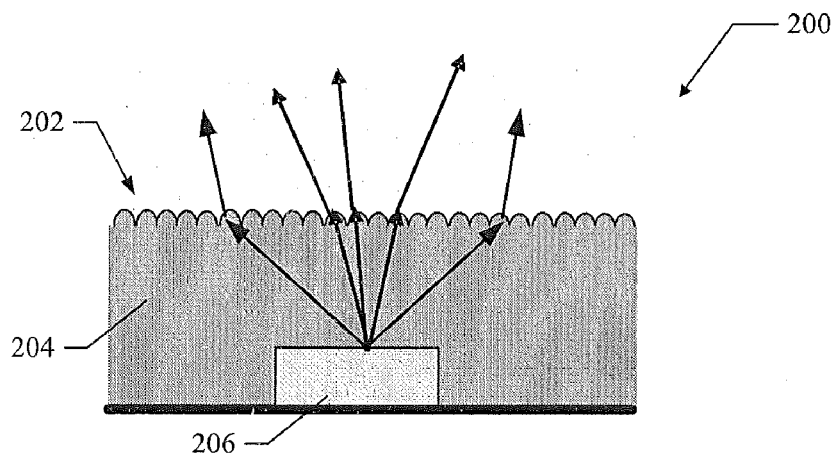
FIG. 2 shows a LED assembly with a surface-textured encapsulation configured for light extraction.

FIG. 2 shows aspects of a LED assembly 200 with a surface-textured encapsulation configured for light extraction. For example, the LED assembly 200 includes an encapsulation 204 that comprises a textured surface 206 that is formed upon LED 202. In an aspect, the textured surface 206 comprises a field of geometric features or shapes (in this case hemisphere shapes) that are stamped, or molded, or pattern transferred, or otherwise formed upon to the encapsulation 204. However, as described below in various aspects, the textured surface 206 may comprise a variety of geometric shapes.

The textured surface 206 is configured so that light emitted from the LED 202 will incident upon a large portion of the encapsulation surface at angles that are greater than the critical angle. This means that less light will be reflected and more light will be extracted from the LED assembly 200 than from the LED assembly 100. And, since the use of additional lens material is not needed, the LED assembly 200 provides increased light output and excellent heat dissipation properties while avoiding additional processing and manufacturing costs.

In various aspects, the surface-textured encapsulation 204 is suitable for use with virtually any color LED. For example, the surface-textured encapsulation 204 will extract additional light emitted from red, blue, green, amber or white LEDs. It should also be noted that the surface-textured encapsulation can be used with other types of light sources and is not limited to be used only with LED light sources. Furthermore, the surface-textured encapsulation 204 may be composed of any suitable material, such as silicone or phosphor.

Figure 3:
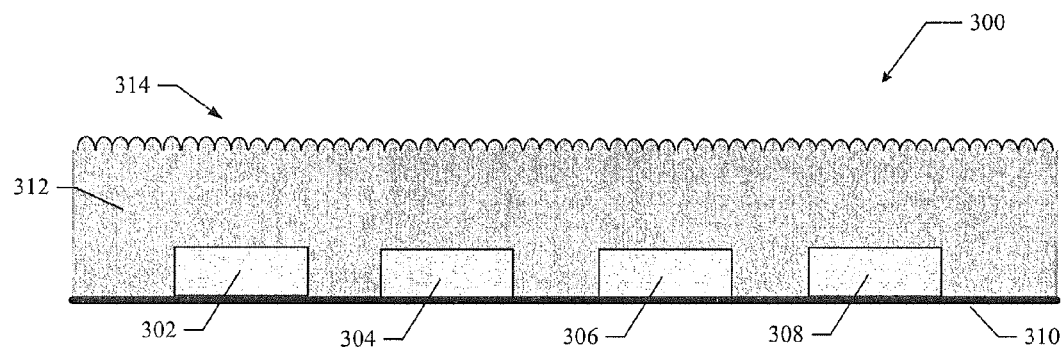
FIG. 3 shows aspects of a multi-LED assembly with surface-textured encapsulation.

FIG. 3 shows aspects of a multi-LED assembly 300 with surface-textured encapsulation. The assembly 300 comprises LEDs 302-308 mounted to a substrate 310. The assembly 300 also comprises encapsulation 312 have a textured surface 314. The textured surface 314 is configured to extract light emitted by the LEDs 320-308. Thus, FIG. 3 illustrates that aspects of an encapsulation with surface-texturing is scalable for use with any number of LEDs and these LEDs can be any combination of LEDs of different colors to increase light output while providing excellent heat dissipation and avoiding the processing costs of additional lens material.

Figure 4:
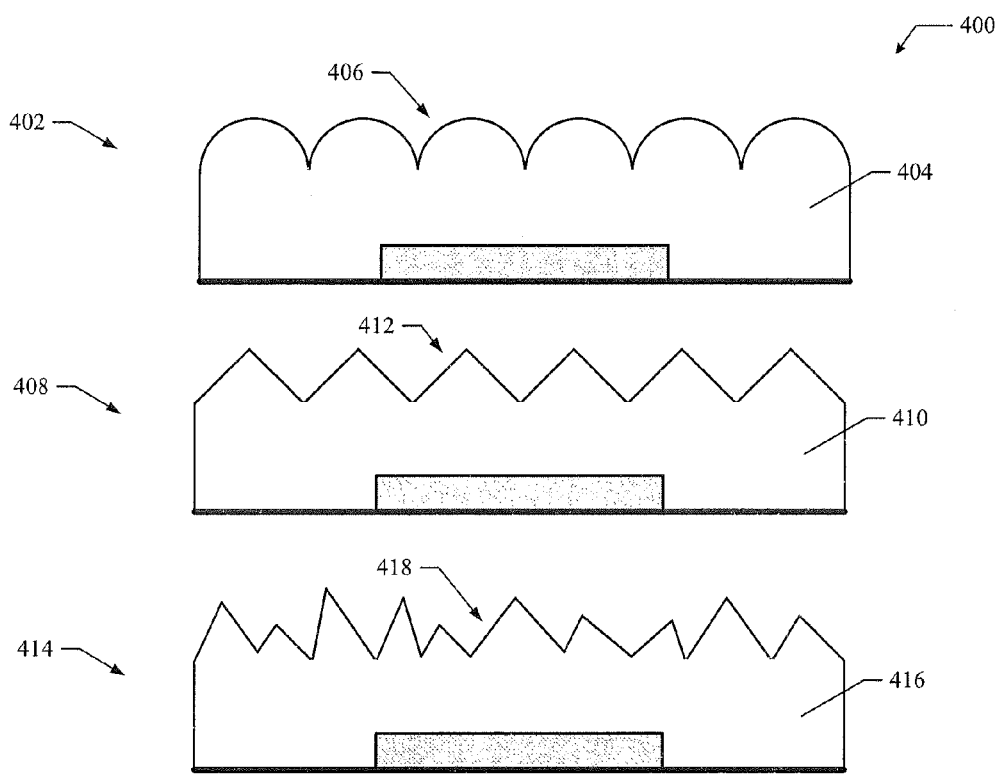
FIG. 4 shows aspects of three LED assemblies having encapsulations comprising different surface texturing.

FIG. 4 shows aspects of three LED assemblies 400 having encapsulations comprising different surface texturing. FIG. 4 illustrates that surface texturing comprising a variety of geometric features or shapes may be use to improve light extraction from LED assemblies.

A first LED assembly 402 is shown having an encapsulation 404 with surface texturing 406 comprising geometric shapes forming hemispheres. The dimensions of the hemispheres (i.e., radius) are selected to provide an increase amount of extracted light as opposed to an un-textured encapsulation. For example, if a square LED is used that has a side dimension of two millimeters; the radius of the hemispheres may be in the range of one micrometer to one millimeter. Thus, the radius of the hemispheres is less than the dimension of the LED or other suitable light source.

It should also be noted that in various aspects, the geometric features or shapes may have varying dimensions. For example, the hemispheres shown at 406 may have varying dimensions and are not limited to having the same dimensions.

A second LED assembly 408 is shown having an encapsulation 410 with surface texturing 412 comprising geometric shapes forming cones or pyramids. The dimensions of the cones or pyramids (i.e., base area and height) are selected to provide a desired amount of extracted light.

A third LED assembly 414 is shown having an encapsulation 416 with surface texturing 418 comprising random geometric shapes. The random geometric shapes may have any dimensions to provide a desired amount of extracted light. For example, random pyramid shapes having a range of base areas and heights may be selected to provide a desired amount of light extraction.

Thus, the LED assemblies 400 illustrate that surface texturing comprising a variety of features or geometric shapes may be use to improve light extraction in accordance with the various aspects.

Figure 5:
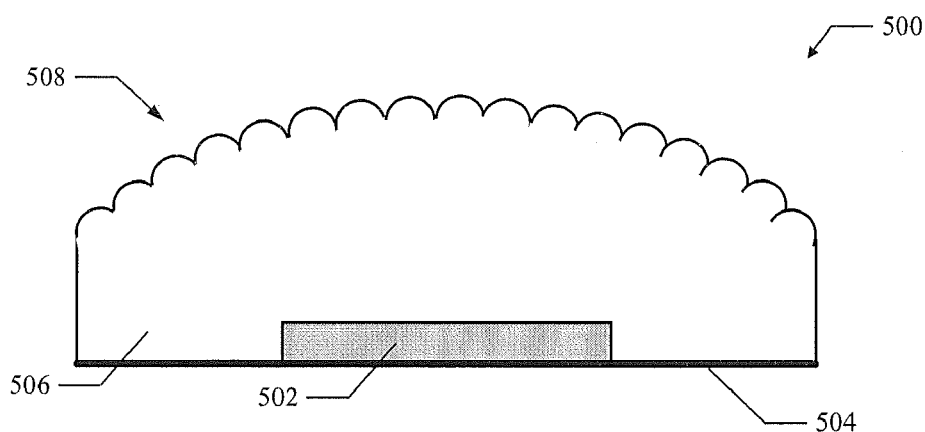
FIG. 5 shows a LED assembly that comprises aspects of surface textured encapsulation wherein the overall shape of the encapsulation is selected to provide for additional light extraction.

FIG. 5 shows a LED assembly 500 that comprises aspects of surface textured encapsulation wherein the overall shape of the encapsulation is selected to provide for additional light extraction. For example, the LED assembly 500 comprises a LED 502, substrate 504, and encapsulation 506. The encapsulation 506 comprises surface texturing 508 in accordance with the various aspects presented herein. The encapsulation 506 also has an overall shape to provide additional light extraction. For example, the encapsulation 506 has an overall dome shape (i.e., higher at the center than at the edges) that is configured to provide additional light extraction. It should be noted that aspects of the surfaced textured encapsulation are not limited to encapsulations with a dome shape as illustrated in FIG. 3 and that any desired overall encapsulation shape may be utilized to provide for increased light extraction.

Thus, aspects of surface textured encapsulations described herein may comprise any desired overall shape to improve light extraction.

Figure 6:
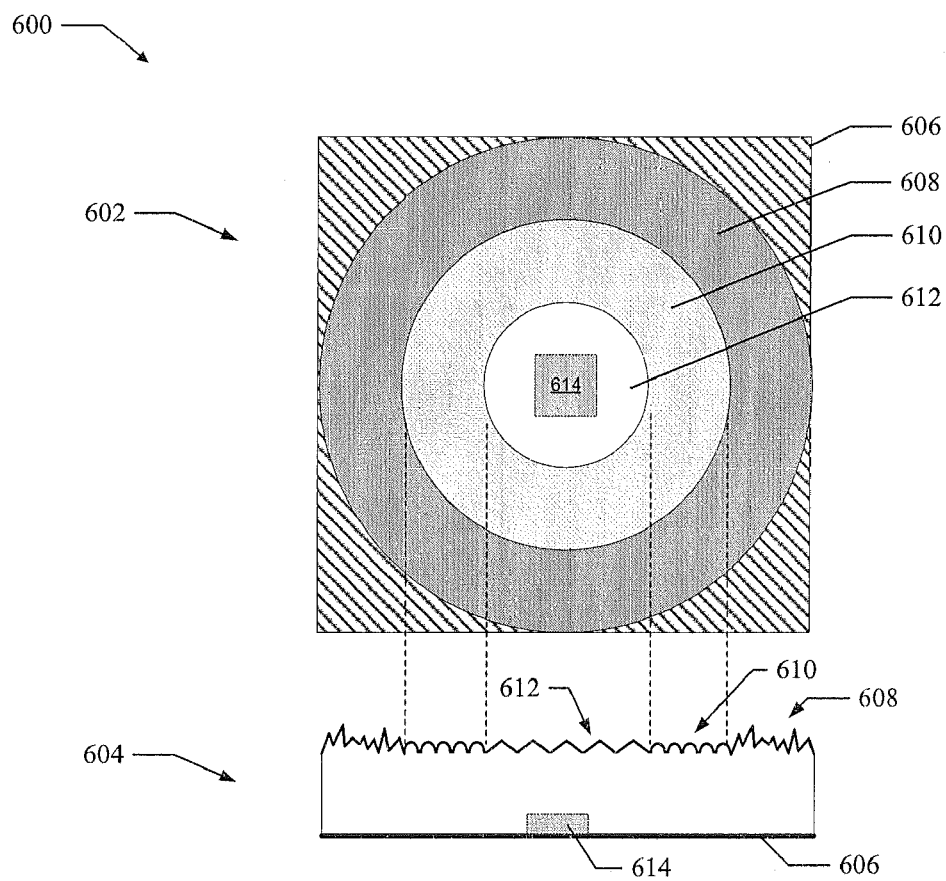
FIG. 6 shows a LED assembly comprising aspects of an encapsulation having multiple surface-textured regions.

FIG. 6 shows a LED assembly 600 comprising aspects of an encapsulation having multiple surface-textured regions. For example, to illustrate the multiple surface-textured regions, the LED assembly 600 is shown in a side view perspective 604 and a corresponding top view perspective 602. The LED assembly 600 comprises LED 614, substrate 606 and a multiple surface-textured encapsulation regions.

The multiple surface-textured encapsulation regions comprise a first region 608 having a random surface texturing. A second region 610 is provided that has a hemisphere shaped surface texturing, and a third region 612 is provided that has a cone shaped surface texturing.

Thus, in various aspects, a surface-textured encapsulation may comprise multiple regions where each region provides surface-texturing using different geometric shapes. As a result, an increased amount of light is extracted from a LED assembly over that of LED assemblies having smooth and/or flat encapsulations.

Formation of Surface-Texturing

In various aspects, encapsulations having surface-texturing can be formed using a variety of techniques. For example, referring again to FIG. 6, the surface-textured features provided at 608, 610, and 612 can be formed upon, created by, and/or applied to the encapsulation using one or more of the following techniques.

1. Molding—The encapsulation is molded to include the desired surface-textured features.
2. Stamping—The encapsulation is stamped to include the desired surface-textured features. For example, a partially-cured silicone encapsulation is stamped with a specially created stamp to form the desired features on the silicone surface. The silicone is allowed to fully cure thereby retaining the desired surface-texturing.
3. Pattern Transfer—A pattern layer is placed on top of the silicone or phosphor layer encapsulation. The pattern layer is stamped or molded and then etched so that the stamped or molded pattern is transferred (or applied) to the silicone or phosphor layer encapsulation.

Figure 7:
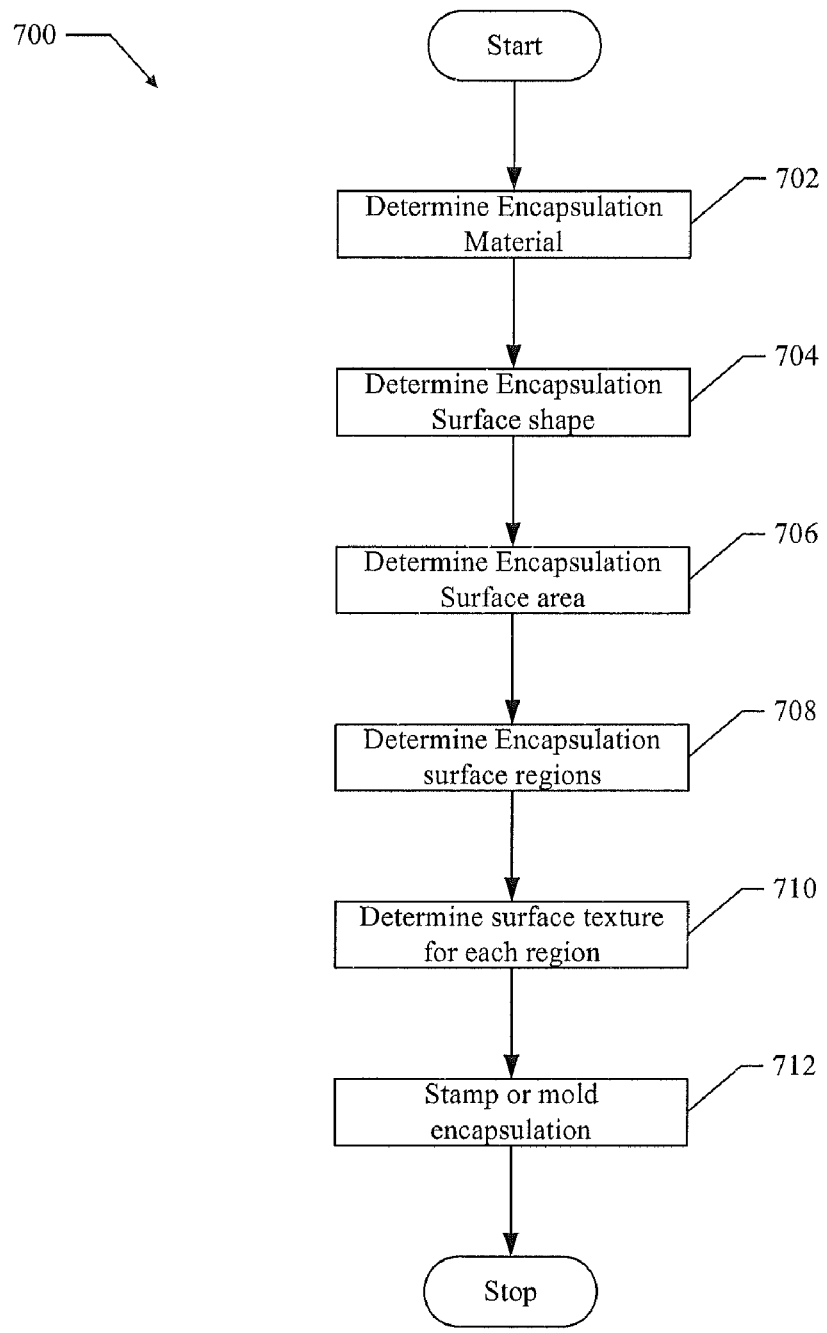
FIG. 7 shows an exemplary method for generation surface-textured encapsulations for extracting light from LEDs.

FIG. 7 shows an exemplary method 700 for generating surface-textured encapsulations for extracting light from LEDs. For clarity, the method 700 is described below with reference to the surface-textured encapsulations shown in FIGS. 5-6.

At block 702, an encapsulation material is determined. For example, the encapsulation material may be selected to be silicone or a phosphor layer.

At block 704, an encapsulation overall surface shape is determined. For example, the overall encapsulation surface shape may be approximately flat, domed as illustrated in FIG. 5, or any other desired surface shape.

At block 706, an encapsulation surface area is determined. For example, once the encapsulation surface shape is determined, the overall surface area is determined.

At block 708, encapsulation surface regions are determined. In an aspect, the surface regions divide the surface area determined at block 706. The encapsulation may be configured to comprise any number of surface regions.

At block 710, surface texturing for each surface region is determined. For example, each surface region may be surface-textured with a different geometric shape or feature. Thus, as illustrated in FIG. 6, each region may be surface-textured to provide a desired amount of light extraction.

At block 712, the encapsulation undergoes a stamping, or molding or pattern transferring process to have the surface shape, surface regions, and surface texturing in each region as configured in the operations above. It should also be noted that although several techniques have been disclosed herein for forming encapsulations with surface-texturing, virtually any technique or process may be used to generated encapsulations having surface-texturing as described herein.

Therefore, the method 700 operates to generate surface-textured encapsulations so that an improved amount of light can be extracted from a LED assembly as opposed to an un-textured encapsulation. It should be noted that the method 700 is just one implementation and that the operations of the method 700 may be rearranged or otherwise modified within the scope of the various aspects. Thus, other implementations are possible with the scope of the various aspects described herein.

Figure 8:
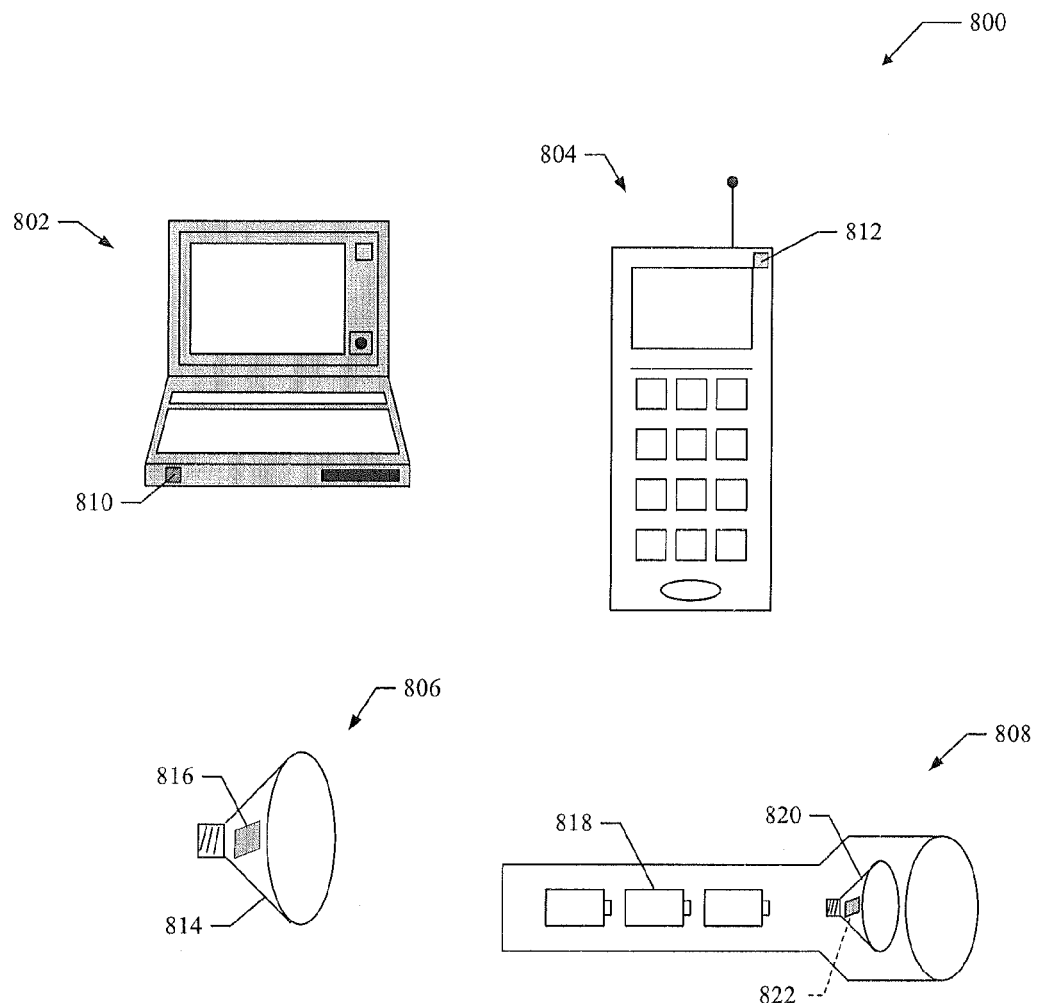
FIG. 8 shows exemplary devices having LED's with surface textured encapsulations as described herein

FIG. 8 shows exemplary devices 800 suitable for use with LED's having surface textured encapsulations as described herein. For example, FIG. 8 shows a computer 802, a lamp 806 and an illumination device 808. Each of the devices shown in FIG. 8 comprises a LED having a surface-textured encapsulation configured for light extraction as described herein. For example, the computer 802 comprises LED 810 and the portable telephone 804 comprises LED 812. The LEDs 810 and 812 have surface textured encapsulations as described herein to provide for increase light output with excellent heat dissipation and low processing costs.

The lamp 806 comprises a package 814 and LED 816. The LED 816 has a surface-textured encapsulation configured for light extraction as described herein. The lamp 806 may be used for any type of general illumination. For example, the lamp 806 may be used in an automobile headlamp, street light, overhead light, or in any other general illumination application. The illumination device 808 comprises a power source 818 that is electrically coupled to a lamp 820. In an aspect, the power source 818 may be batteries or any other suitable type of power source, such as a solar cell. The lamp 820 comprises a LED 822 which has a surface-textured encapsulation configured for light extraction as described herein.

It should be noted that surface textured encapsulations as described herein are suitable for use with virtually any type of LED, which in turn may be used in any type of illumination device and are not limited only to the devices shown in FIG. 8. Thus, the surfaced-textured encapsulations described herein provide for increased extraction of light emitted from LEDs and can be used in a variety of device applications.

The description of the disclosed aspects is provided to enable any person skilled in the art to make or use the present invention. Various modifications to these aspects may be readily apparent to those skilled in the art, and the generic principles defined herein may be applied to other aspects, without departing from the spirit or scope of the invention. Thus, the present invention is not intended to be limited to the aspects shown herein but is to be accorded the widest scope consistent with the principles and novel features disclosed herein. The word "exemplary" is used exclusively herein to mean "serving as an example, instance, or illustration." Any aspect described herein as "exemplary" is not necessarily to be construed as preferred or advantageous over other aspects.

Accordingly, while aspects of surface-textured encapsulations have been illustrated and described herein, it will be appreciated that various changes can be made to the aspects without departing from their spirit or essential characteristics. Therefore, the disclosures and descriptions herein are intended to be illustrative, but not limiting, of the scope of the invention, which is set forth in the following claims.

What is claimed is:

1. A light emitting diode apparatus comprising:
   a light emitting diode;
   an encapsulation formed upon the light emitting diode and having a surface-texturing configured to extract light: and
   wherein said surface-texturing comprises one plane with at least a first region with pyramid non-periodic features and at least a second region with periodic features including semi-spherical features that are configured to extract light.

2. The apparatus of claim 1, wherein said encapsulation comprises clear silicone.

3. The apparatus of claim 1, wherein said encapsulation comprises a phosphor-containing silicone layer.

4. The apparatus of claim 1, wherein said encapsulation is stamped with the surface-texturing.

5. The apparatus of claim 1, wherein said encapsulation is molded to form the surface-texturing.

6. The apparatus of claim 1, wherein said encapsulation receives the surface-texturing through a pattern transfer process.

7. The apparatus of claim 1, wherein said surface-texturing comprises one or more geometric features configured for light extraction.

8. The apparatus of claim 1, further comprising multiple light emitting diodes within the encapsulation.

9. The apparatus of claim 1, further comprising multiple light emitting diodes within the encapsulation.

10. A lamp comprising the light emitting diode apparatus of claim 1.

11. An illumination device comprising the light emitting diode of claim 1.

12. The apparatus of claim 1, wherein said non-periodic features comprise random pyramid shapes having a range of base areas and heights.

\* \* \* \* \*